United States Patent
Pelletier et al.

(10) Patent No.: US 6,287,436 B1
(45) Date of Patent: *Sep. 11, 2001

(54) BRAZED HONEYCOMB COLLIMATOR

(75) Inventors: Dominic Gerard Pelletier, Groveland; Nis Krauskopf; Scott James Gregory, both of Gloucester, all of MA (US)

(73) Assignee: Innovent, Inc., Peabody, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,648

(22) Filed: Feb. 27, 1998

(51) Int. Cl.[7] .................................................. C23C 14/34
(52) U.S. Cl. ...................... 204/298.11; 118/720; 428/116; 428/118
(58) Field of Search ........................ 204/298.11, 192.12; 228/181, 182; 118/720; 428/116, 118

(56) References Cited

U.S. PATENT DOCUMENTS

| 3,217,845 | 11/1965 | Reynolds et al. .................. 29/191 |
| 4,006,268 | 2/1977 | Kennedy et al. ................... 427/42 |
| 4,050,131 | 9/1977 | Bryand ............................. 29/121.3 |
| 4,333,598 | 6/1982 | Ittner et al. ...................... 228/181 |
| 4,491,265 | * 1/1985 | Ittner et al. ...................... 228/181 |
| 4,542,596 | 9/1985 | Bryand et al. ..................... 34/115 |
| 4,632,862 | 12/1986 | Mullen ............................. 428/116 |
| 4,869,421 | * 9/1989 | Norris et al. ..................... 228/181 |
| 5,064,493 | 11/1991 | Smith, II .......................... 156/207 |
| 5,135,156 | * 8/1992 | Bower ............................. 228/181 |

(List continued on next page.)

FOREIGN PATENT DOCUMENTS

| 0155034A2 A3 | 9/1985 | (EP) . |
| 0 634 779 A1 | 1/1995 | (EP) . |
| WO 95/21457 | 8/1995 | (WO) . |
| WO 96/24155 | 8/1996 | (WO) . |

OTHER PUBLICATIONS

The Random House College Dictionary, pp. 165, 1975.*

Diploma Thesis by Nis Krauskopf "Developing a Brazed Metal Foil Honeycomb Collimator" pp. 5–53, Nov. 1997.*

Till & Luxon, "Integrated Circuits: materials, devices, and fabrication", Prentice–Hall, 1982, p. 269.

Amerasekera & Campbell, "Failure Mechanisms in Semiconductor devices", Wiley & Sons, 1987 pp. 22–26, 50,52–54,67–84,107,109,120,139–141.

Lange, "Sources of Wafer Contamination", Semiconductor International, Apr. 1983.

Schmidt, "Furnace Contamination and Its Remedies", Solid–State Technology, Jun. 1983.

Mattox, "Handbook of Physical Vapor Deposition (PVD) Processing", Noyes Publications, 1998.

Diploma Thesis by Nis Krauskopf entitled "Developing a Brazed Metal Foil Honeycomb Collinator", Coven sheet, pp. 5–53 (undated). 11/97.

Primary Examiner—Rodney G. McDonald
(74) Attorney, Agent, or Firm—Testa, Hurwitz & Thibeault, LLP

(57) ABSTRACT

A collimator filter for a physical vapor deposition apparatus useful for coating semiconductor wafers includes a plurality of corrugated ribbons attached at abutting double-walled nodes by resistance spot welding. The nodes are sealed by application of a braze material to diverging wall portions of the nodes by extrusion or spraying, followed by heating in a vacuum furnace. Alternatively, the nodes may be sealed by application of a braze material foil to a top and a bottom surface of the collimator followed by heating in the vacuum furnace. By sealing the nodes, a significant reduction may be achieved in outgassing and generation of particulate contaminants.

10 Claims, 4 Drawing Sheets

U.S. PATENT DOCUMENTS

| | | | |
|---|---|---|---|
| 5,223,108 | 6/1993 | Hurwitt | 204/192.12 |
| 5,300,813 | 4/1994 | Joshi et al. | 257/752 |
| 5,346,601 | 9/1994 | Barada et al. | 204/192.15 |
| 5,362,372 | 11/1994 | Tepman | 204/192.12 |
| 5,376,179 | 12/1994 | Lee | 118/722 |
| 5,380,414 | 1/1995 | Tepman | 204/192.3 |
| 5,382,339 | 1/1995 | Aranovich | 204/192.12 |
| 5,391,275 | 2/1995 | Mintz | 204/192.32 |
| 5,401,675 | 3/1995 | Lee et al. | 437/192 |
| 5,403,459 | 4/1995 | Guo | 204/192.32 |
| 5,403,779 | 4/1995 | Joshi et al. | 437/190 |
| 5,409,587 | 4/1995 | Sandhu et al. | 204/192.12 |
| 5,419,029 | 5/1995 | Raaijmakers | 29/447 |
| 5,431,799 | 7/1995 | Mosely et al. | 204/298.06 |
| 5,549,802 | 8/1996 | Guo | 204/298.11 |
| 5,580,823 | 12/1996 | Hegde et al. | 437/192 |
| 5,598,622 | 2/1997 | Raaijmakers | 29/447 |
| 5,650,052 | 7/1997 | Edelstein et al. | 204/192.12 |
| 5,737,178 | 4/1998 | Herchen | 361/234 |
| 5,756,222 | 5/1998 | Bercaw et al. | 428/649 |
| 5,858,819 | 1/1999 | Miyasaka | 438/149 |
| 6,126,791 | 10/2000 | Pavate et al. | 204/192.13 |
| 6,132,492 | 10/2000 | Hultquist et al. | 95/45 |
| 6,132,564 | 10/2000 | Licata | 204/192.15 |

\* cited by examiner

BRAZED HONEYCOMB COLLIMATOR

TECHNICAL FIELD

The present invention relates to physical vapor deposition ("PVD") apparatus for coating articles and more particularly to an improved method of manufacturing a collimator filter used in PVD processing of semiconductor wafers.

BACKGROUND INFORMATION

A PVD process may be used to deposit a target material such as titanium or titanium nitride onto a semiconductor wafer or other article. In a typical PVD apparatus, the target material and the article to be coated are disposed in a vacuum chamber containing an inert gas such as argon. An electrically conductive shield is generally provided circumscribing the target and the article. Upon application of a sufficiently high electrical potential between the cathodic target and the anodic shield, the inert gas ionizes, forming a high energy plasma. Relatively high mass, positively charged plasma ions impinge the negatively charged target with sufficient energy to expel atoms from the target, forming a physical vapor. The expelled or sputtered target atoms follow various ejection trajectories due to initial direction and subsequent collision with other sputtered target atoms, plasma ions, and inert gas molecules. The sputtered particle vapor fills the chamber and the particles eventually deposit on exposed surfaces of the article to be coated. A typical PVD apparatus or sputter deposition device is described in U.S. Pat. No. 4,824,544 issued to Mikalesen et al., the disclosure of which is herein incorporated by reference in its entirety.

Semiconductor wafer surfaces to be coated, while macroscopically planar, include numerous microscopic surface features including apertures such as contact openings and vias, raised portions such as mesas, and depressed channels. To provide uniform coating of these surfaces, a collimator filter may be disposed between the target and the semiconductor wafer. The collimator structure forms a plurality of passages or apertures passing therethrough, the apertures having respective centerlines oriented substantially normally to the wafer surface. Accordingly, solely sputtered atoms traveling along normal and near normal trajectories pass through the collimator and are deposited on the wafer, while those traveling along oblique trajectories greater than a critical angle are deposited on the collimator. The angular range of trajectories which pass through the collimator is predetermined by manufacturing the collimator passages to a selected height and cross-sectional configuration and size. Collimators are especially useful for ensuring coating of bottom and side walls of wafer apertures and channels having a large aspect ratio since they prevent excessive buildup of deposited material at the aperture and channel openings which can bridge the openings, leaving voids therebelow. Aspect ratio is the ratio of aperture diameter or channel width to depth of the feature.

Conventional collimators may be made by individually machining a plurality of apertures through a solid disk of material. The apertures are typically holes of cylindrical cross-section machined by conventional processes such as by drilling or by non-conventional metal removal techniques such as by electrical discharge machining ("EDM"), wire EDM, abrasive water jet cutting, and laser machining. Machined collimators produce a relatively large amount of waste material, tend to be relatively heavy due to required minimum wall thickness between adjacent apertures, and are costly to produce due to the extensive machining operation. Further, the ratio of collimator passage open area to unmachined area between the passages is relatively low, resulting in excessive blockage of sputtered atoms traveling along otherwise acceptable normal and near normal trajectories. Alternatively, collimators may be manufactured by close packing of a plurality of discrete tubes or by creating a grid of square or rectangular passages by using a series of intersecting plates as disclosed by Mikalesen et al. Such collimators, however, also tend to be relatively heavy, costly to produce, and generate imprecise collimator passage geometries.

Another method of manufacturing collimators includes corrugating thin strips of metal foil and attaching the strips to one another by welding at nodes where adjacent foil strip wall sections contact one another. While such welded collimators may be lighter and produce less blockage than machined collimators, a contamination problem exists inherently due to the manufacturing process.

For proper PVD processing of semiconductor wafers, the PVD apparatus components, the semiconductor wafer, and the vacuum chamber inert gas must be substantially free from contaminants. Contaminants in the vacuum chamber, either in the form of foreign particulate or gaseous matter, may be deposited on the wafer and on the chamber component surfaces during the PVD process. Such contaminants render a certain percentage of the devices on the wafer and subsequently processed wafers unusable, negatively impacting process yields and increasing cost per device.

Welded collimators produce inherently both bonded and unbonded areas in the nodes. Further, welded collimators produce gaps or voids in the nodes due to locally irregular geometries of the wall sections which are neither perfectly flat nor perfectly mated. Because of these voids, foreign matter introduced during the manufacturing process may become trapped in the nodes. This foreign matter, as well as a buildup of target material on the collimator, can be released or flake off during PVD processing due to sliding, flexing, and other relative motion of the imperfectly bonded wall sections caused by uneven heating and thermal cycling of the collimator. Additionally, periodically during the useful life of the collimator, the collimator is cleaned of built up target material by submersion in an acid etch bath or similar chemical cleaning solution, typically followed by rinsing in deionized water. Thereafter, the collimator is heated to anneal the structure and remove any residual internal stresses resulting from PVD process thermal cycling. Residual contaminants typically remain trapped in the voids in the nodes. Once the welded collimator is placed in the PVD vacuum chamber and the vacuum chamber is evacuated to as low as about $1 \times 10^{-8}$ Torr, these trapped contaminants can be released by a process known as outgassing or offgassing by those skilled in the art. Such outgassing continues for hours and potentially continues for the remaining useful life of the welded collimator. Outgassing is exacerbated during PVD processing due to thermal effects at the elevated temperatures required for PVD processing, which may be on the order of about 600° C. (1100° F.).

Accordingly, there exists a need in the art for a light weight, low cost, low blockage collimator which is not subject to outgassing and which does not generate particulate contaminants under. PVD processing conditions.

SUMMARY OF THE INVENTION

A collimator for a PVD apparatus includes web members of substantially similar configuration formed by bending a metallic, metalloid, or ceramic ribbon into a plurality of substantially similar contiguous wall sections. Typical ribbon materials include aluminum, stainless steel, nickel-base alloys such as Inconel, titanium, and titanium-base alloys. The web members are positioned adjacent to one another to form collimator passages therebetween. Abutting walls constitute double-walled sections or nodes which may be permanently secured by welding and subsequently sealed by brazing, preferably with a nickel-base brazing alloy. In the case of titanium web members, a titanium-base brazing alloy may be used. Braze material may be applied to the nodes by a variety of processes including manually applying a braze paste to the nodes with a syringe, manually or automatically spraying a braze composition on the collimator in an oriented pattern, and covering the entire collimator with a braze foil and a face sheet. Upon heating, the braze material migrates into the voids between the wall sections, effectively sealing the nodes and providing a fillet between diverging wall sections of the ribbons. In one embodiment, the formed collimator passages have cross-sectional configurations resembling hexagons creating a nested honeycomb appearance. Collimator passages of other cross-sectional configurations may also be produced such as triangles, squares, rectangles, or other nestable shapes.

Brazed collimators, according to the invention, are relatively light weight and efficient to produce, and also exhibit low blockage. Importantly, the braze material seals the nodes substantially completely, creating a fillet between the abutting web member wall sections. There are no voids or deep fissures to capture particulate or fluidic contaminants which may be released or outgas at PVD processing temperatures and pressures. Since respective perimeters of the nodes are sealed, the brazed collimator is stiffer than a geometrically similar conventional welded collimator. There are no unbonded areas about the nodes which may be subject to relative motion and generation of particulate contaminants. Further, flaking of built up sputter material is reduced. Also, by brazing the entire collimator as an assembly at the braze activation temperature in a vacuum, pre-existing contaminants in the nodal areas are outgassed. The collimator is also advantageously annealed, relieving internal stresses which might otherwise induce relative web movement and generation of particulate contaminants or flaking during PVD processing.

BRIEF DESCRIPTION OF THE DRAWINGS

The invention, in accordance with preferred and exemplary embodiments, together with further advantages thereof, is more particularly described in the following detailed description taken in conjunction with the accompanying drawings in which.

MADE(S) FOR CARRYING OUT THE INVENTION

Figure 1:
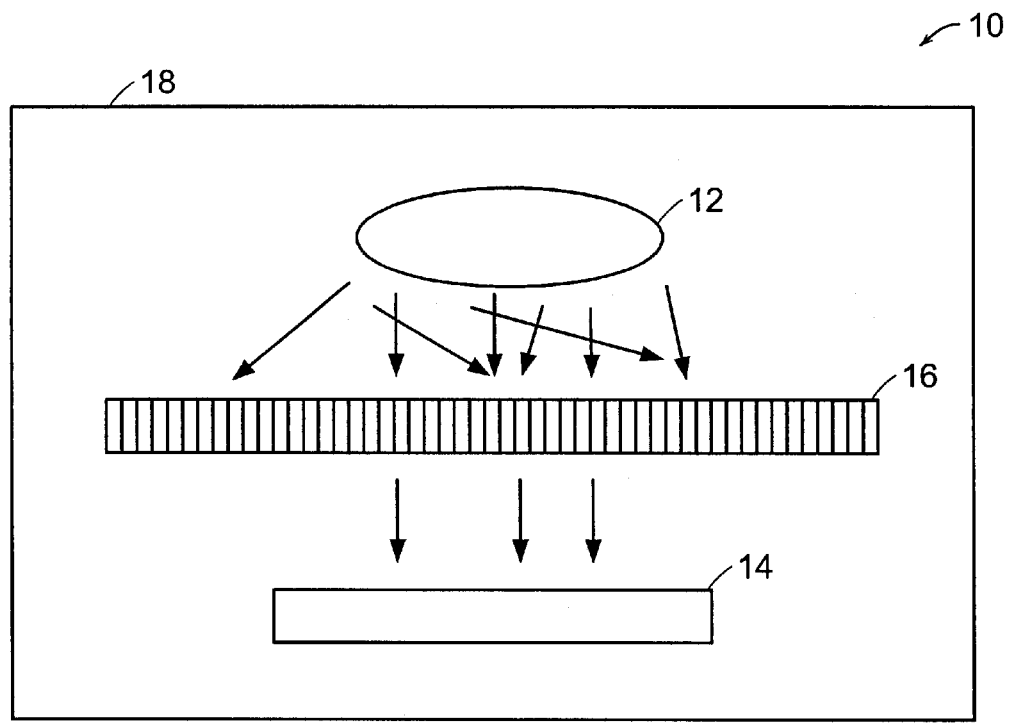
FIG. 1 is a schematic view of a portion of a PVD apparatus incorporating a brazed honeycomb collimator in accordance with an embodiment of the present invention.

FIG. 1 is a schematic view of a PVD apparatus 10. The apparatus 10 includes a sputtering source 12 made of a material such as titanium, copper, tungsten, or other electrically conductive material which is to be deposited on a semiconductor wafer 14. A brazed honeycomb collimator 16 is interdisposed between the source 12 and the wafer 14 to provide a uniform coating on the wafer 14 by passing therethrough solely sputtered atoms traveling in a normal or near normal trajectory relative to the surface of the wafer 14. Sputtered atoms traveling at oblique angles are effectively captured by the collimator 16, being deposited on its surface. The critical angle range for atom trajectories is determined by the cross-sectional shape and height of the collimator passages. The PVD process takes place under a vacuum in a sealed chamber 18 at elevated temperatures.

Figure 2:
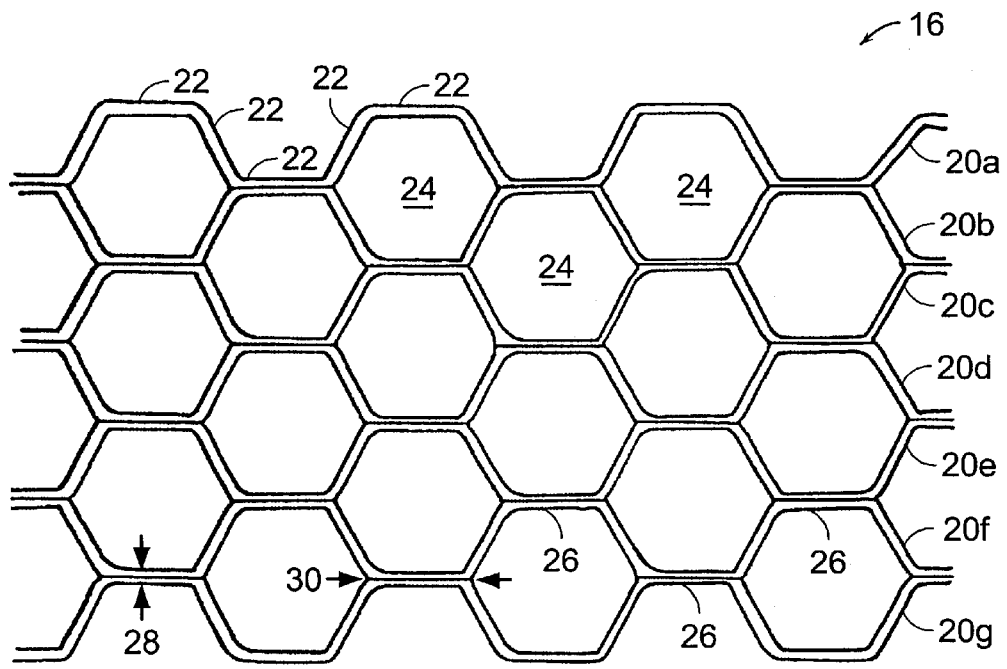
FIG. 2 is a schematic, plan view of a portion of a brazed honeycomb collimator in accordance with an embodiment of the present invention.

FIG. 2 is a schematic, plan view of a portion of the brazed honeycomb collimator 16. The collimator 16 may be manufactured from flat roll stock of the desired material, thickness, and width. The roll stock is passed through mating contoured rollers to form a corrugated web or ribbon. Seven such ribbons 20a–20g are depicted, each ribbon 20 including a plurality of contiguous, substantially planar wall sections 22. To form the nested honeycomb or hexagonally shaped apertures or passages 24 through which the sputtered atoms pass, proximate wall sections 22 of each ribbon 20 form an included angle of about 120 degrees. When the ribbons 20 are aligned to form the hexagonal passages 24, double-walled nodes 26 result therebetween. The abutting wall sections are permanently attached to each other by any of a variety of welding techniques such as plasma arc welding, electron beam welding, laser welding, tungsten inert gas welding, and spot welding. For example, an electron beam may be used to seam weld the nodes 26 along an exposed edge, a plasma arc torch may be used to create one or more linear welds along a node face, or a spot welder may be used to create one or more spot welds along a face. In one embodiment, the nodes 26 are secured by six spot welds oriented in two columns of three welds each along the face of the node as depicted generally at 28.

Figure 3:
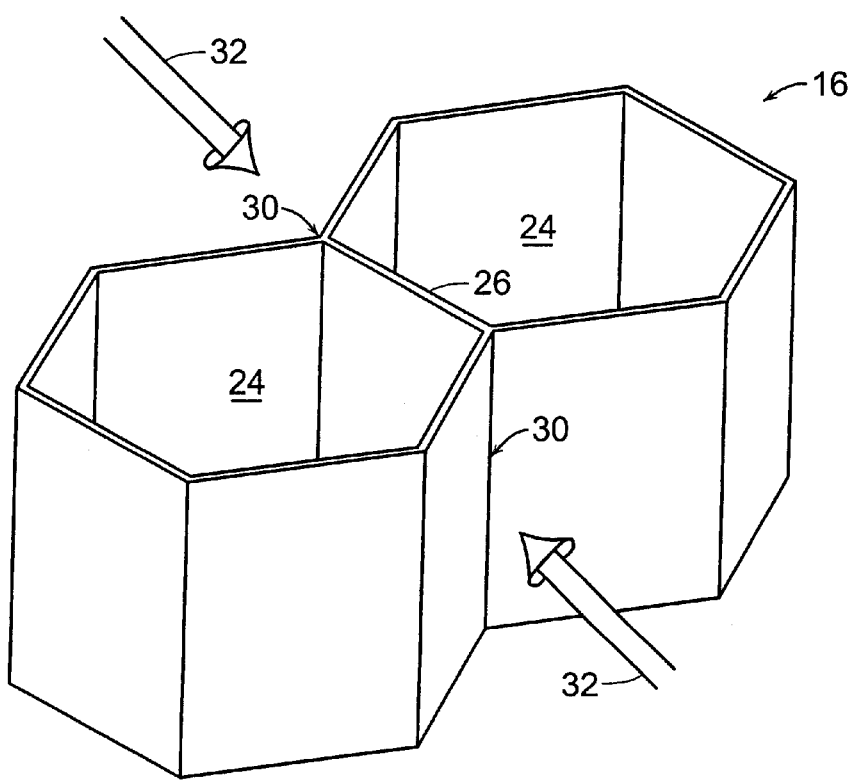
FIG. 3 is a schematic perspective view of a portion of the honeycomb collimator depicted in FIG. 2 being manufactured in accordance with one embodiment of the present invention.

FIG. 3 is a schematic perspective view of a portion of the honeycomb collimator 16 depicted in FIG. 2. Solely two adjacent passages 24 and a single interdisposed double-walled node 26 are shown. Associated with each node 26 are two diverging wall portions shown generally at 30. Braze material may be applied thereat to form a brazed fillet between the diverging wall portions 30 by a variety of techniques. According to one method, a braze alloy is mixed with a binder and two vertical beads are applied to respective crotches of the diverging wall portions 30 using a syringe. According to another method, the braze alloy is mixed with the binder and applied to the diverging wall portions 30 using a spray gun. With the collimator 16 in a horizontal orientation as depicted, the collimator 16 is sprayed along the direction of the diverging wall portions 30 with the spray gun oriented at about a 45 degree angle to horizontal, first from one direction and then the opposite direction as depicted generally by arrows 32. By traversing the surface of the collimator 16 in this manner, the braze material is deposited primarily in the crotches formed by the diverging wall portions 30. After completing the spray pattern on a first side of the collimator 16, the collimator 16 may be inverted and the pattern repeated on the other side. The collimator is then heated in a furnace cycle above the braze temperature as will be discussed in greater detail hereinbelow.

Figure 4:
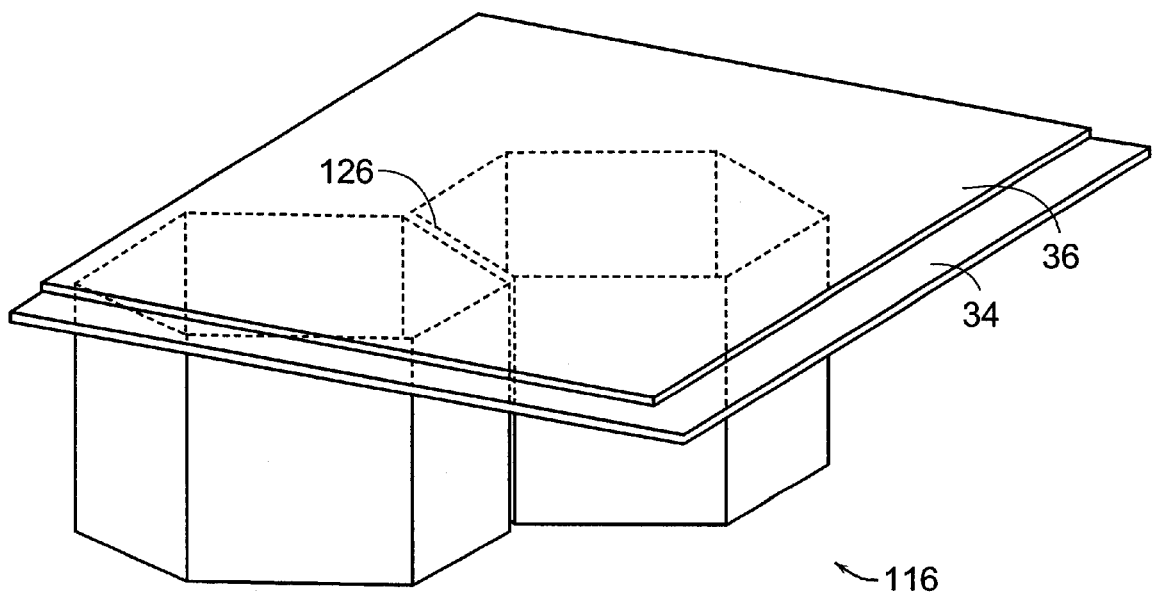
FIG. 4 is a schematic perspective view of a portion of the honeycomb collimator depicted in FIG. 2 being manufactured in accordance with an alternative embodiment of the present invention.

While the braze material application methods discussed with respect to FIG. 3 perform well with collimators manufactured from stainless steel and other materials which are wetted readily by the braze material, an alternative brazing method has been developed for use with collimators manufactured from titanium and titanium alloys which tend not to wet as readily. FIG. 4 is a schematic perspective view of a portion of a titanium honeycomb collimator 116 manufactured in accordance with this alternative method. A braze alloy in the form of a foil sheet 34 is disposed on a first side of the collimator 116. Thereafter, a face sheet 36 is applied over the foil 34. Both the foil 34 and the face sheet 36 may be secured temporarily to the collimator 116 by resistance spot welding to an upper surface of the collimator 116 at several locations. Another foil 34 and face sheet 36 may be applied to an opposite side of the collimator 116. The collimator 116 is then heated in a furnace cycle above the braze temperature of the foil 34. As the foil 34 liquefies, the braze material wets the face sheet and is drawn into the double-walled nodes 126 by capillary action. After completing the brazing cycle, the face sheets 36 are bonded to the collimator 116 by residual braze material and may be removed by conventional machining processes such as milling or grinding. Alternatively, the face sheets 36 may be removed by electrical discharge machining, so as to minimize distortion of the collimator 116. A recast layer created by the EDM process may thereafter be removed, if desired, by acid etch followed by ultrasonic cleaning in deionized water.

Figure 5A:
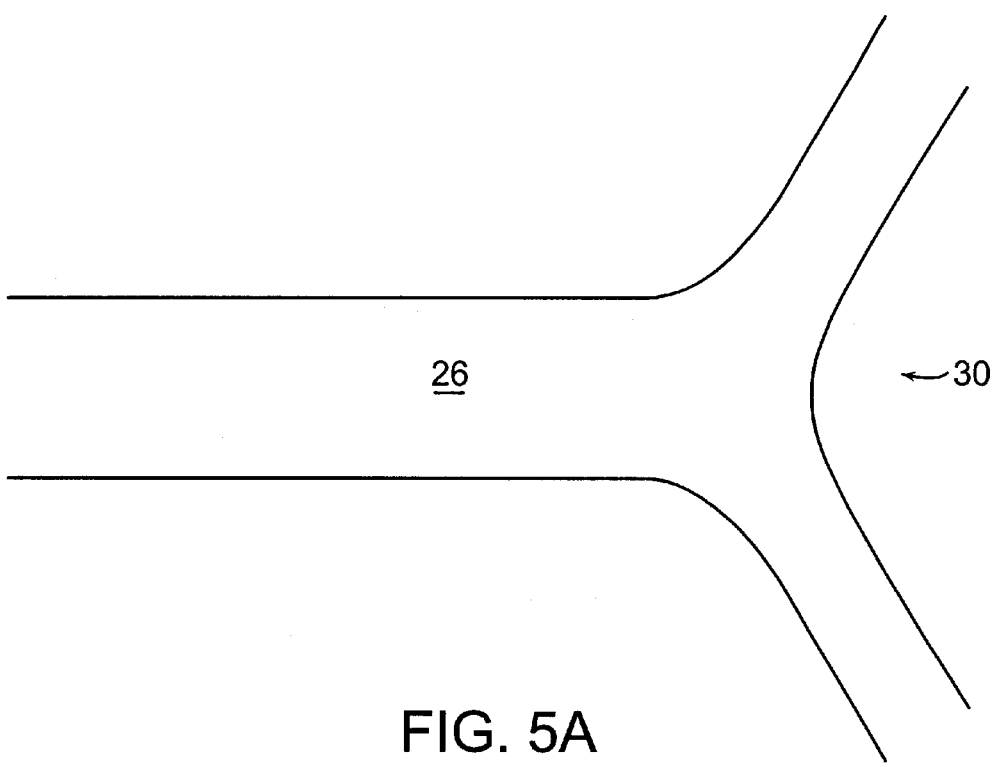
FIG. 5A is an enlarged schematic plan view of a portion of a brazed node in accordance with an embodiment of the present invention.
Figure 5B:
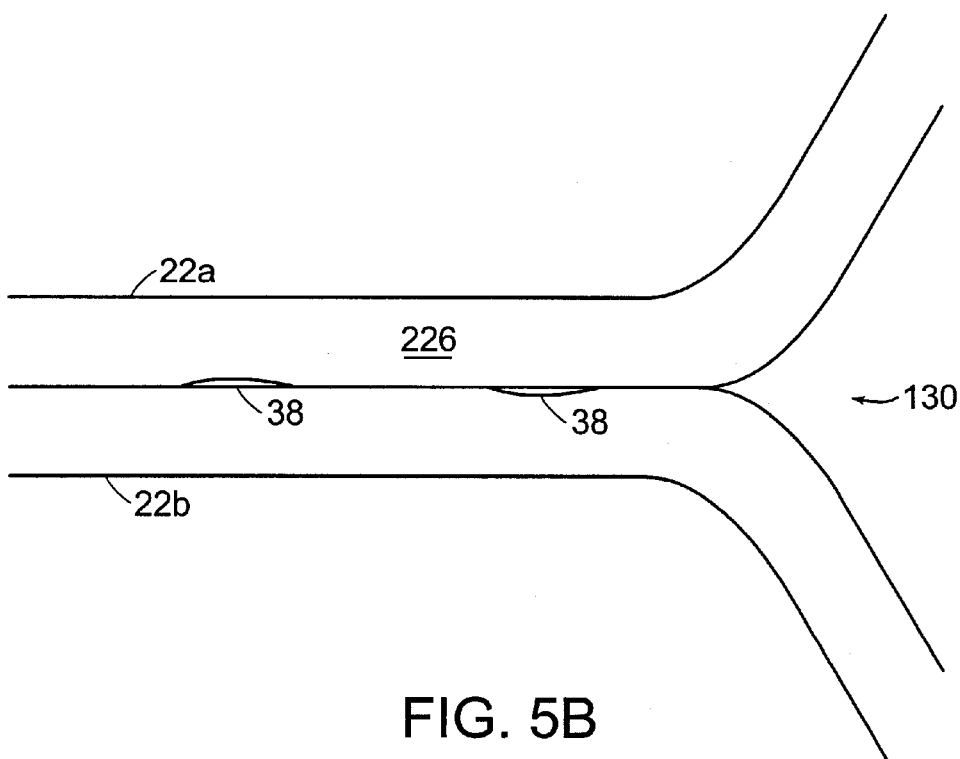
FIG. 5B is an enlarged schematic plan view of a portion of a prior art spot welded node.

FIGS. 5A and 5B are enlarged schematic views of respective diverging wall portions 30, 130 of a brazed node 26 according to the invention and an unbrazed node 226 according to the prior art. The diverging wall portion 30 of the brazed node 26 includes a generous fillet of braze material; whereas, the diverging wall portion 130 of the unbrazed node 226 forms a sharp crevice in which foreign material can become trapped. Further, the unbrazed node 226 will generally include voids or gaps 38 due to local irregular geometries of the abutting wall sections 22a, 22b in which contaminants can be trapped and subsequently outgas. The brazed node 26, however, is substantially sealed so that voids or gaps caused by geometric irregularities are filled or blocked and outgassing is substantially precluded.

A variety of factors guide the selection of an appropriate braze material for sealing the nodes 26. One factor is the compatibility of the braze material with the collimator ribbon material and the degree of resultant wetting. Wetting is desirable to ensure adequate flow of the braze by capillary action into the nodes 26. For example, for collimators manufactured from aluminum, stainless steel, and nickel-base alloys, a powdered nickel-base alloy braze material may be used; whereas, for collimators manufactured from titanium and titanium alloys, a titanium alloy powder or foil may be used. Additionally, the braze material should melt at a low enough temperature to prevent thermal distortion of the collimator during the brazing cycle, yet at a high enough temperature so as not to flow during the PVD process which can be on the order of about 600° C. (1100° F.). Further, the braze material should not contain any constituents which would contaminate the wafer 14 to be coated and therefore adversely effect the operation of the resultant semiconductor. For example, boron is commonly used in braze alloys to depress the melting point and enhance diffusion; however, boron may be detrimental to the electrical insulating characteristics of the semiconductor wafer 14. Other active common braze alloy constituents such as platinum, potassium, silver, and gold may also be problematic. Chemically and metallurgically inactive constituents such as silicon, chromium, and nickel are considered to be acceptable and may be used on collimators of a variety of materials. For titanium and titanium alloy collimators, a composition foil having outer layers of pure titanium and an inner layer of a copper-nickel alloy may be used, as well as an alloy powder of titanium, copper, and nickel.

EXAMPLE 1

A collimator was manufactured from stainless steel 316L material (0.03C-2.0Cr-1.0Si16/18Cr-10/14Ni-0.045P-0.03S) by resistance spot welding corrugating ribbons to created a nested honeycomb pattern substantially similar to that depicted in FIG. 2. The ribbons were formed from 0.038 cm (0.015 inch) thick stock having a width of about 1.59 cm (0.625 inches). After welding, the collimator was cleaned by soaking first in acetone, then in alcohol, followed by air drying. AMS 4782 E, Mesh 140, braze powder (Ni71, Cr19, Si10) available from Wall Colmony Corporation located in Madison Heights, Michigan was mixed with Nicrobraz S binder, also available from Wall Colmony Corporation, in the recommended 10:1 ratio to form a thick slurry. The slurry was manually applied to the diverging wall portions of the collimator by extrusion through a syringe with a tip diameter of about 0.083 cm (0.033 inches). The binder was allowed to air dry. No flux was used due to the possibility of interaction with the braze material at elevated temperatures during the brazing cycle and the likelihood of flux residue which would have to be removed after brazing. Further, the Nicrobraz S binder is polymer based and substantially completely outgasses as temperatures above about 500° C. (930° F.).

The prepped collimator was placed in a vacuum furnace which was sealed and pumped down to below about $5 \times 10^{-4}$ Torr vacuum and heated to about 930° C. (1700° F.) at a rate of about 11 to 17° C./min (20 to 30° F./min). The temperature was held for 15 minutes while thermocouples which had been placed proximate the collimator equalized. Thereafter, the temperature was increased to about 1180° C. (2150° F.) at the same rate and held at this temperature for about 5 minutes. The furnace was then cooled to about 815° C. (1500° F.) then rapid quenched with argon to below about 90° C. (200° F.). Inspection of several samples revealed that non-porous full fillets were achieved by applying between about 0.125 grams and about 0.150 grams of the braze material to each diverging wall portion.

EXAMPLE 2

A collimator was manufactured from titanium CP Grade 4 material (Ti, <0.4O, <0.5Fe) by resistance spot welding corrugating ribbons to created a nested honeycomb pattern substantially similar in configuration to that discussed in Example 1. TiCu15Ni15 braze powder available from WESGO Metals Division located in Melrose, Massachusetts was mixed with Nicrobraz S or Vitta FC 15 binders, the latter available from Vitta Corporation located in Bethel, Connecticut, in the recommended 3:1 ratio to form thick slurries. The slurries were manually applied to the diverging wall portions of several collimators by extrusion through a syringe.

The vacuum furnace and graphite fixturing were prepared by loading the fixturing into the furnace, sealing the furnace, and pumping the furnace down to below about $5 \times 10^{-4}$ Torr vacuum. The furnace was heated to about 1260° C. (2300° F.) at a rate of about 11 to 17° C./min (20 to 30° F./min) and held at temperature for about one hour followed by a rapid quench with argon to below about 120° C. (250° F.).

The prepped collimators were next loaded into the furnace on ceramic plates, taking care that there was no direct contact between the collimators and graphite fixturing which would contaminate the collimators and/or braze alloy as known by those skilled in the art. The furnace was sealed and pumped down to below $5 \times 10^4$ Torr vacuum and heated to about 540° C. (1000° F.) at a rate of about 11 to 17° C./min (20 to 30° F./min). The temperature was equalized then increased to about 930° C. (1700° F.) at the same rate and held at this temperature for about 20 minutes. Next the furnace was heated to a temperature of about 1080±8° C. (1980±15° F.) at a rate of about 6° C./min (10° F./min) and held for about 10–12 minutes. The furnace was then allowed to cool to about 540° C. (1000° F.) under vacuum then rapid quenched with argon to below about 120° C. (250° F.). Both the Nicrobraz S and Vitta FC 15 binders exhibited good results.

EXAMPLE 3

A stainless steel collimator similar to that discussed in Example 1 was prepared for brazing by application of the braze material using a Binks Model 180 spray gun available from Binks Manufacturing Company located in Franklin Park, Illinois. AMS 4782 E, Mesh 140, braze powder and Nicrobraz 520 binder, also available from Wall Colmony Corporation, were added to the appropriate containers in the spray gun. The gun was adjusted to exhibit a pattern of binder and alloy on a smooth surface wherein the alloy sticks to the surface without excessive wetting by the binder which would cause the braze material to run when applied to a vertical surface. The collimator was sprayed in several passes along the ribbon direction with the spray gun held at about a 45 degree angle as discussed hereinabove with respect to FIG. 3. The collimator was inverted and the process repeated. The collimator was weighed before and after application of the braze material to quantify the average weight of braze material per node.

The collimator was brazed in accordance with the brazing cycle presented in Example 1. Here again, good results were achieved by applying between about 0.125 grams and about 0.150 grams of the braze material to each diverging wall portion.

EXAMPLE 4

A titanium collimator similar to that discussed in Example 2 was prepared for brazing by being covered with a TiCu15Ni15 braze foil available from WESGO Metals Division located in Melrose, Massachusetts. The foil was about 0.010 cm (0.004 inches) thick and consisted of pure titanium outer layers sandwiching a copper-nickel alloy inner layer. The foil, in turn, was covered by a face sheet of titanium CP Grade 4 foil, also about 0.010 cm (0.004 inches) thick. The braze foil and face sheet were secured to the collimator by resistance spot welding at two locations on the collimator.

The collimator was brazed in accordance with the brazing cycle presented in Example 2; however, the maximum furnace temperature before cooling was about 1040° C. (1900° F.). The cycle resulted in good wetting of the nodes and production of even fillets in the diverging wall sections. The face sheet was subsequently removed by EDM.

Cross-sections of several of the brazed nodes were prepared and examined in a scanning electron microscope. Of particular interest were the titanium samples in which the joint separation line between the abutting wall sections disappeared. Analysis of the resultant grain structure revealed fine Widmannstatten structure, typical in titanium joints brazed with titanium-base filler materials. A diffusion bond was created across the former joint line, converting the double-walled node into a single solid structure with grains overlapping the former joint line.

Once a collimator is brazed, additional processing steps may be followed as with conventional collimators. For example, the collimator may be cleaned by grit blasting. Thereafter, titanium collimators may be flame sprayed with molybdenum and stainless steel collimators flame sprayed with stainless steel. As known by those skilled in the art, the application of such materials increases the number of nucleation sites on the collimator and enhances the capability of the collimator to capture errant sputtered target material atoms. Finally finish machining of the collimator outer contour, heat treating, and cleaning may be performed.

Figure 6:
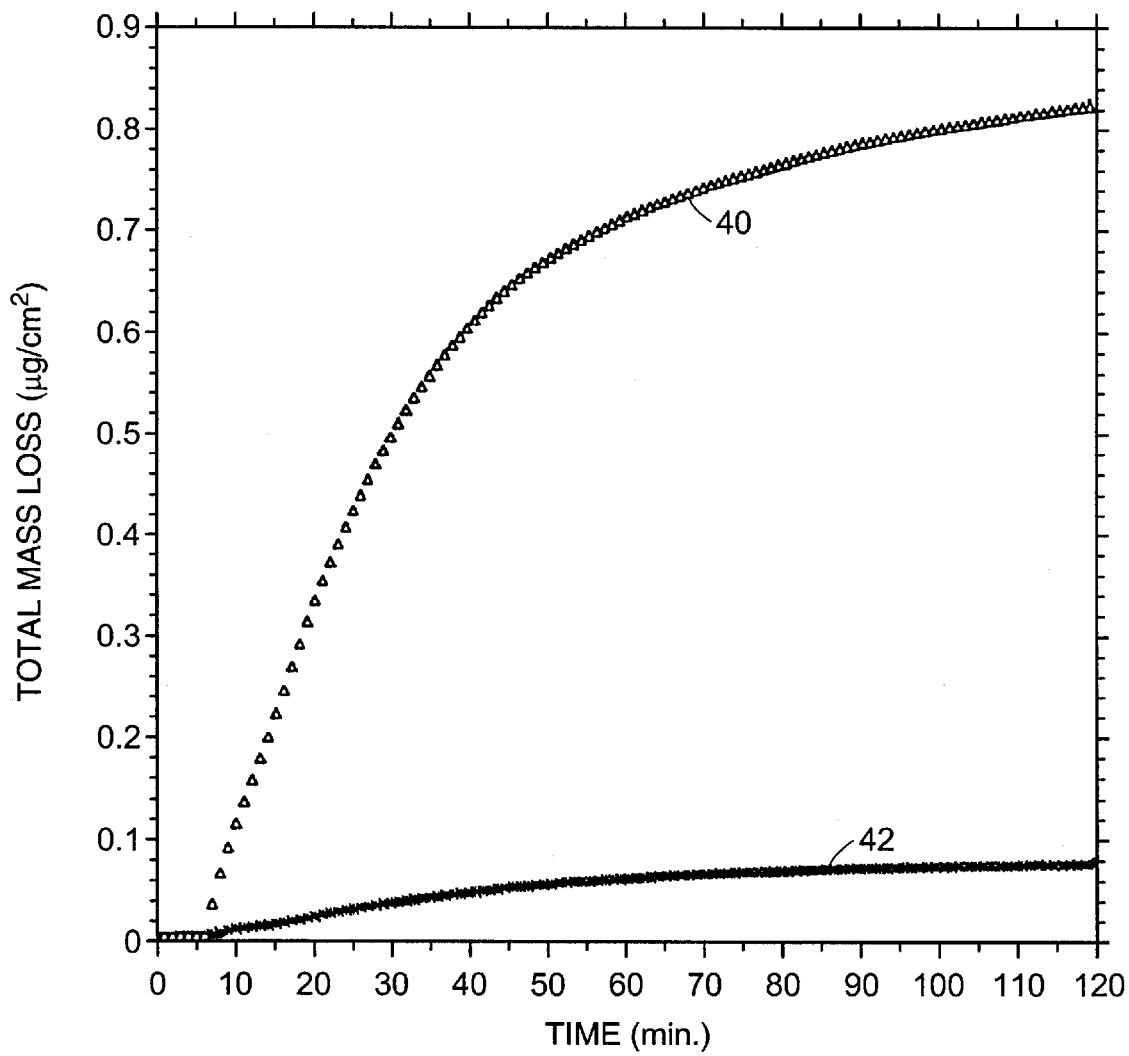
FIG. 6 is a plot comparing total mass loss due to outgassing of a conventional welded honeycomb collimator test sample and a brazed honeycomb collimator test sample in accordance with the present invention.

Referring now to FIG. 6, a test was conducted to evaluate the outgassing characteristics of a conventional resistance spot welded collimator and a brazed collimator in a vacuum environment at elevated temperature after comparable cleaning steps. Two test samples of each type were prepared, each having seven honeycomb passages and ten nodes. Each sample was about 5.6 cm (2.2 inches) in diameter and about 1.59 cm (0.625 inches) in height. Each sample was placed in a temperature controlled effusion cell and loaded into a load lock chamber where they were evacuated for about two minutes. The samples were then transferred into a test chamber which was evacuated to a pressure of about $1 \times 10^{-9}$ Torr. The samples were induction heated to about 125° C. (257° F.) and monitored for two hours. The quantities of outgassed substances leaving the effusion cell were detected by three quartz crystal micro-balances. After correcting for test chamber background, total mass loss data in units of mass per unit surface area ($\mu g/cm^2$) was plotted as a function of time. Upper curve 40 represents measured data for the welded, non-brazed collimator sample. Lower curve 42 represents measured data for the brazed collimator sample.

After two hours, the total mass loss of the conventional collimator sample was 0.836 $\mu g/cm^2$ compared to 0.074 $\mu g/cm^2$ for the comparable brazed collimator sample, a difference of greater than an order of magnitude. Accordingly, the brazed collimator can be expected to perform better in PVD processing by introducing substantially fewer contaminants into the PVD chamber resulting in a higher wafer yield. Further, cycle time required for post-cleaning outgassing of the brazed collimator can be significantly reduced resulting in additional semiconductor manufacturing cost savings.

After use for a time in a PVD apparatus, a collimator becomes coated with a buildup of deposited sputter material. To extend the useful life of the collimator, the collimator can be cleaned of the deposited material by submerging the collimator in an acid etch bath of, for example, hydrofluoric acid and nitric acid for about one hour, followed by rinsing in deionized water and air drying. Testing which subjected a brazed collimator to a two hour acid etch bath revealed no degradation of the braze fillets in the nodes. There was no corrosion cracking or porosity exhibited which could adversely effect the demonstrated outgassing superiority of the brazed collimators relative to conventional collimators. Accordingly, an order of magnitude reduction in post cleaning outgassing, similar to that depicted graphically in FIG.

6, is contemplated for used brazed collimators relative to used welded collimators, where both have been cleaned of built up sputter material in an acid etch bath.

While there have been described herein what are to be considered exemplary and preferred embodiments of the present invention, other modifications of the invention will become apparent to those skilled in the art from the teachings herein. For example, other collimator ribbon materials may be used such as aluminum oxide-base and zirconium-base materials, as long as the resultant materials are formable and brazable. Further, other braze materials can be used on titanium and titanium alloy collimators such as TiCu20Ni20 powder or foil. Still further, in an alternative structural embodiment, a collimator for a PVD apparatus may include web members of substantially similar configuration formed by bending a ribbon into a plurality of substantially similar contiguous wall sections, some of which form slits therein. The web members may be interlocked with one another along respective slits thereof to form the collimator passages. The interlocking wall sections constitute nodes which may be permanently secured and sealed by brazing with a suitable braze material. Welding of the nodes is optional. Still further, the brazing process is applicable to collimators manufactured from closely packed tubes, hexagonal stock, and other nestable elements. For such collimators, nodes are formed wherever side walls of proximately disposed elements abut.

It is therefore desired to be secured in the appended claims all such modifications as fall within the true spirit and scope of the invention. Accordingly, what is desired to be secured by Letters Patent is the invention as defined and differentiated in the following claims.

What is claimed is:

1. A PVD collimator comprising:
   a first web member comprising a first wall section;
   a second web member comprising a second wall section abutting and being spot welded to the fist wall section to form a first node; and
   a braze material disposed about the first node to substantially seal the first node, wherein the braze material is characterized by absence of constituents which would contaminate a semiconductor wafer being coated when the PVD collimator is in use in a PVD apparatus and wherein the PVD collimator is characterized by absence of a face sheet bonded thereto.

2. A PVD collimator according to claim 1 wherein:
   the first web member further comprises a third wall section;
   the second web member further comprises a fourth wall section abutting the third wall section to form a second node spaced from the first node; and
   a braze material disposed about the second node to substantially seal the second node.

3. A PVD collimator according to claim 2 wherein the first web member and the second web member form a passage therebetween bounded in part by the first node and the second node.

4. A PVD collimator according to claim 3 wherein the passage has a cross-sectional configuration resembling a hexagon.

5. A PVD collimator according to claim 1 wherein the braze material comprises a nickel-base alloy.

6. A PVD collimator according to claim 5 wherein the first web member and the second web member comprise a material selected from the group consisting of aluminum, stainless steel, and nickel-base alloy.

7. A PVD collimator according to claim 1 wherein the braze material comprises a titanium-base alloy.

8. A PVD collimator according to claim 7 wherein the first web member and the second web member comprise a material selected from the group consisting of titanium and titanium-base alloy.

9. A PVD collimator comprising:
   a first ribbon comprising a plurality of contiguous wall sections;
   a second ribbon comprising a plurality of contiguous wall sections, the second ribbon abutting and being spot welded to the first ribbon at a plurality of nodes to form a plurality of passages passing through the PVD collimator; and
   a braze material disposed about respective nodes to substantially seal the nodes and to provide a fillet between diverging wall sections of the first ribbon and the second ribbon, wherein the braze material is characterized by absence of constituents which would contaminate a semiconductor wafer being coated when the PVD collimator is in use in a PVD apparatus.

10. A PVD collimator according to claim 9 wherein the passages have respective cross-sectional configurations resembling hexagons to form a nested honeycomb pattern.

* * * * *